United States Patent [19]

Mine et al.

[11] Patent Number: 4,942,497
[45] Date of Patent: Jul. 17, 1990

[54] COOLING STRUCTURE FOR HEAT GENERATING ELECTRONIC COMPONENTS MOUNTED ON A SUBSTRATE

[75] Inventors: Shinji Mine; Terumi Shimonishi, both of Tokyo, Japan

[73] Assignee: NEC Corporation, Tokyo, Japan

[21] Appl. No.: 222,818

[22] Filed: Jul. 21, 1988

[30] Foreign Application Priority Data

Jul. 24, 1987 [JP] Japan ................................ 62-185182
Jul. 29, 1987 [JP] Japan ................................ 62-189201
Aug. 19, 1987 [JP] Japan ................................ 62-204168
Oct. 15, 1987 [JP] Japan ................................ 62-157800

[51] Int. Cl.⁵ ............................................ H05K 7/20
[52] U.S. Cl. .................................... 361/385; 165/80.4; 165/185; 174/16.3; 357/82; 361/382; 361/386
[58] Field of Search ................. 165/80.4, 185, 104.33; 174/15.1, 15.2, 16.3; 357/79, 81, 82; 361/381, 382, 385–389; 62/383

[56] References Cited

U.S. PATENT DOCUMENTS

| | | | |
|---|---|---|---|
| 2,783,418 | 2/1957 | Peter et al. | 361/385 |
| 3,205,469 | 9/1965 | Frank et al. | 361/414 |
| 3,211,969 | 10/1965 | Colaiaco | 361/385 |
| 3,651,865 | 3/1972 | Feldmanis | 165/80.4 |
| 3,777,220 | 12/1973 | Tatusko et al. | 361/361 |
| 3,908,188 | 9/1975 | Kawamoto | 357/82 |
| 3,912,001 | 10/1975 | Missman et al. | 165/80.4 |
| 3,993,123 | 11/1976 | Chu et al. | 165/80 |
| 4,037,270 | 7/1977 | Ahmann et al. | |
| 4,093,971 | 6/1978 | Chu et al. | 361/382 |
| 4,109,707 | 8/1978 | Wilson et al. | 165/46 |
| 4,110,549 | 8/1978 | Goetzke et al. | 174/16.3 |
| 4,115,836 | 9/1978 | Hutchison et al. | |
| 4,158,875 | 6/1979 | Tajima et al. | 361/384 |
| 4,196,775 | 4/1980 | Groh | 165/68 |
| 4,204,246 | 5/1980 | Arii et al. | 361/385 |
| 4,245,273 | 1/1981 | Feinberg et al. | 361/382 |
| 4,282,924 | 8/1981 | Faretra | 165/80.4 |
| 4,381,032 | 4/1983 | Cutchaw . | |

(List continued on next page.)

FOREIGN PATENT DOCUMENTS

57-106062 7/1982 Japan ................................ 361/414
572951 9/1977 U.S.S.R. ............................ 361/382

OTHER PUBLICATIONS

IBM Technical Disclosure Bulletin, "Counter-Flow Cooling System", vol. 8, No. 11, Apr. 1966, Chu, p. 69 (361/385).

IBM Technical Disclosure Bulletin, vol. 20, No. 4, Sep. 1977, "Method of Effective Cooling of a High Power Silicon Chip", Doo et al., pp. 1436–1437 (165/185).

IBM Technical Disclosure Bulletin, vol. 20, No. 11A, Apr. 1978, "Three-Dimentional MLC Substrate Integrated Circuit Support Package", Aichelman et al, pp. 4349–4350 (361/385).

IBM Technical Disclosure Bulletin, vol. 20, No. 11A, Apr. 1978, "Conduction-Cooling Module", Hwang et al. pp. 4334–4335 (361/385).

IBM Technical Disclosure Bulletin, vol. 21, No. 6, Nov. 1978, "Solid Encapsulated Module", Chu et al., pp. 2435–2436 (361/385).

(List continued on next page.)

Primary Examiner—Gregory D. Thompson
Attorney, Agent, or Firm—Burns, Doane, Swecker & Mathis

[57] ABSTRACT

A cooling structure for heat generating electronic components mounted on a substrate. The cooling structure includes a cold plate fixed on the substrate which is provided with first through holes opposed to the respective upper surfaces of the heat generating electronic components, flow paths formed within the cold plate for circulating a coolant, an inlet provided on a side of the cold plate for supplying the coolant into the flow paths, an outlet provided on a side of the cold plate for exhausting the coolant from the flow paths, and pistons inserted through and held within the first through holes so that the lower surfaces of the pistons come into contact with the upper surfaces of the heat generating electronic components.

7 Claims, 4 Drawing Sheets

U.S. PATENT DOCUMENTS

| | | | |
|---|---|---|---|
| 4,398,208 | 8/1983 | Murano et al. | 357/81 |
| 4,468,717 | 8/1984 | Mathias et al. | |
| 4,493,010 | 1/1985 | Morrison et al. | 361/385 |
| 4,498,122 | 2/1985 | Rainal | 361/414 |
| 4,509,096 | 4/1985 | Baldwin et al. | 361/386 |
| 4,535,385 | 8/1935 | August et al. | 361/388 |
| 4,536,824 | 8/1985 | Barrett et al. | 361/384 |
| 4,546,410 | 10/1985 | Kaufman | 361/387 |
| 4,574,879 | 3/1986 | DeGree et al. | 165/185 |
| 4,588,023 | 5/1986 | Munkeawa | 165/104.33 |
| 4,602,125 | 7/1986 | West et al. | 174/16.3 |
| 4,602,678 | 7/1986 | Fick | 165/79 |
| 4,628,990 | 12/1986 | Hagihara et al. | 165/80.4 |
| 4,641,176 | 2/1987 | Keryhuel et al. | |
| 4,644,385 | 2/1987 | Nakanishi et al. | 357/82 |
| 4,666,545 | 5/1987 | DeGree et al. | 156/252 |
| 4,686,606 | 8/1987 | Yamada et al. | |
| 4,712,158 | 12/1987 | Kikuchi et al. | 361/385 |
| 4,721,996 | 1/1988 | Tustaniwskyj et al. | |
| 4,729,424 | 3/1988 | Mizuno et al. | 165/30 |
| 4,744,007 | 5/1988 | Watari et al. | 361/386 |
| 4,748,495 | 5/1988 | Kucharek | |
| 4,750,086 | 6/1988 | Mittal | |
| 4,768,352 | 9/1988 | Maruyama | 62/383 |
| 4,781,244 | 11/1988 | Kuramitsu et al. | 165/80.4 |
| 4,783,721 | 11/1988 | Yamamoto et al. | |
| 4,791,983 | 12/1988 | Nicol et al. | |
| 4,794,981 | 1/1989 | Mizuno | 165/80.4 |

OTHER PUBLICATIONS

IEEE Transactions on Components, Hybrids and Manufacturing Technology, vol. CHMT-2, No. 3, Sep. 1979, "Rumped Tape Automated Bonding (BTAB) Practical Application Guidelines", Kanz et al., pp. 301–308.

IEEE Transactions on Components, Hybrids, and Manufacturing Technology, vol. CHMT-3, No. 1, Mar. 1980, "IBM Multichip Ceramic Modules for LSI Chips", pp. 89–39.

A Scientific American Book, "Microelectronincs", Assembly Techniques, pp. 404–420, 9/77 p. 51.

"Assembly Techniques", pp. 404–420, Intergrated Circuit Engineering.

"Supercomputers Demand Innovation in Packaging and Cooling", Lyman, Electronics, pp. 136–144 (Sep. 22, 1982), pp. 136–144.

IBM Technical Disclosure Bulletin, vol. 18, No. 12, pp. 3982–3983, "Heat-Pipe Cooled Stacked Electronic Wafer Package", Kerjilian et al, May 1976, pp. 3982–3983 (174/152).

The Article by Antonetti et al, IBM Technical Disclosure Bulletin, "Compliant Cold Plate Cooling Scheme", vol. 21, No. 6, 11/78, p. 2431, (361/385).

COOLING STRUCTURE FOR HEAT GENERATING ELECTRONIC COMPONENTS MOUNTED ON A SUBSTRATE

BACKGROUND OF THE INVENTION

The invention relates to a cooling structure for heat generating electronic components such as integrated circuit (IC) chips U.S Pat. No. 4,628,990 discloses an example of prior art cooling structures for IC chips. The prior art structure disclosed, however, has a disadvantage that since a long transmission path of the heat from each of the IC chips to the coolant increases the thermal resistance of the path, the heat generated from the IC chips cannot effectively be dispersed. In addition, since the prior art structure is designed to be used in planar packaging, its height is tall and it is not applicable to three-dimensional packaging.

SUMMARY OF THE INVENTION

An object of the invention is, therefore, to provide a cooling structure free of the above-mentioned disadvantages of the prior art structure.

According to an aspect of the invention, there is provided a cooling structure for heat generating electronic components mounted on a substrate which comprises: a cold plate fixed on the substrate which is provided with first through holes opposed to the upper surfaces of the heat generating electronic components; flow paths formed inside the cold plate for circulating a coolant; an inlet provided on a side of the cold plate for supplying the coolant to the flow paths; an outlet provided on a side of the cold plate for exhausting the coolant from the flow paths; and pistons inserted and held inside the through holes so that the lower surfaces of the pistons come into contact with the upper surfaces of the heat generating electronic components.

BRIEF DESCRIPTION OF THE DRAWINGS

Other features and advantages of the invention will become more apparent from the following detailed description when taken in conjunction with the accompanying drawings in which.

In the drawings, the same reference numerals represent the same structural elements.

DETAILED DESCRIPTION OF THE PREFERRED EMBODIMENTS

Figure 1:
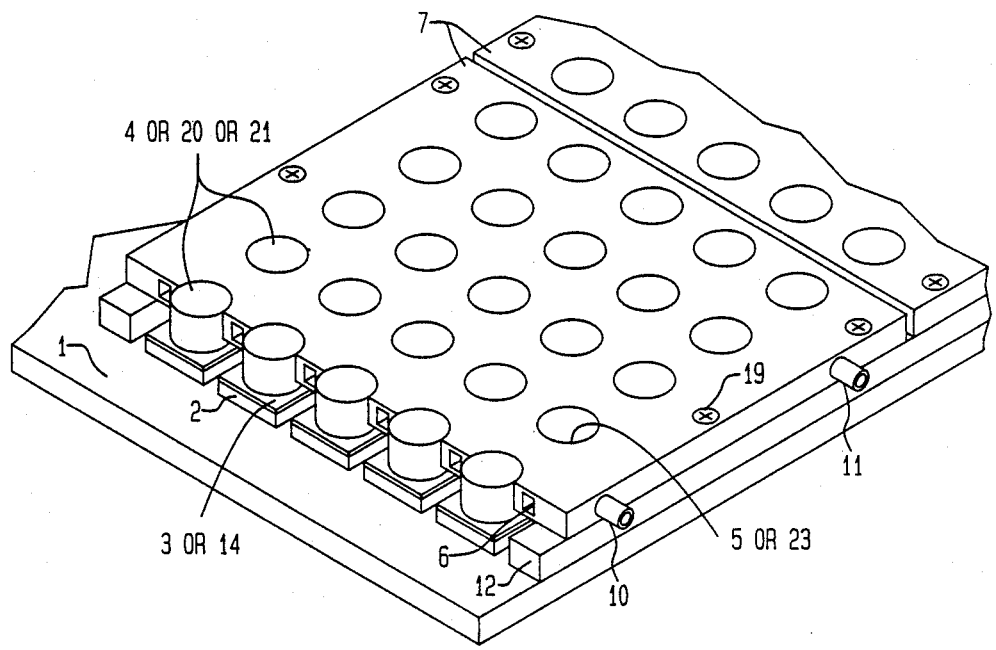
FIG. 1 shows a perspective view with a partially exploded section of first through third embodiments of the invention.
Figure 2:
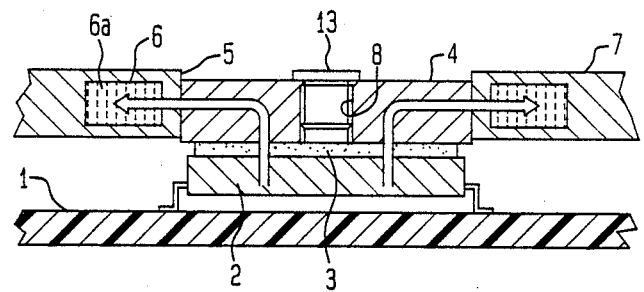
FIG. 2 shows a cross-sectional view of the first embodiment.

Referring to FIGS. 1 and 2, a first embodiment of the invention comprises a substrate 1, IC chips 2 mounted on the substrate 1, elastic heat-conductive sheets 3 of silicone rubber placed on the upper surfaces of the chips 2, pistons 4 in thermal contact with the upper surfaces of the sheets 3, and a cold plate 7 having a plurality of holes 5 and flow paths 6 which cools the pistons 4 inserted in the holes 5 with a coolant 6a circulating through the flow paths 6. The heat generated from the chips 2 is transmitted through the sheets 3, the pistons 4 and the plate 7 to the coolant 6a. Compared to the heat transmission path of the prior art structure mentioned above, the heat transmission path according to the invention is considerably short to achieve an effective radiation of heat.

Figure 3A:
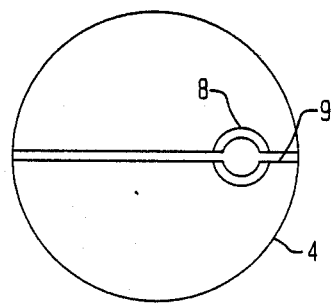
FIG. 3A and 3B are plane and side views of a piston used in the first embodiment respectively.
Figure 3B:
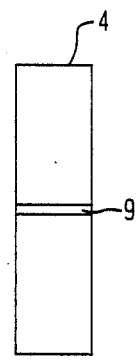

Referring to FIGS. 3A and 3B, each of the pistons 4 is provided with a threaded hole 8 and a slit 9, and has the same structure as that disclosed in the above-mentioned U.S. Patent. Each piston is held within a corresponding one of the holes 5 of the cold plate 7 with a screw 13 in a manner similar to that disclosed in the above-mentioned U.S. Patent.

The plate 7 is provided with an inlet 10 and an output 11 for the coolant 6a on a side thereof. The plate 7 is separated from the substrate 1 by a predetermined distance by stiffeners 12. The plate 7, the stiffeners 12 and the substrate 1 are fixed with screws 19. The plate 7 may be made integrally with the stiffener 12.

Figure 4:
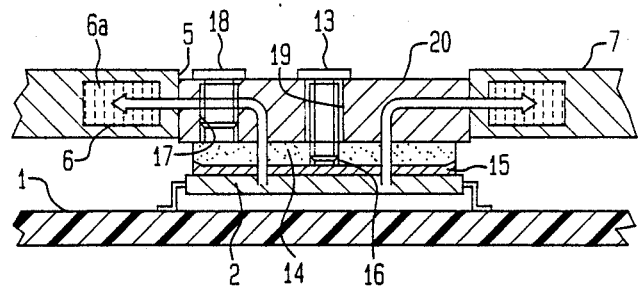
FIG. 4 is a cross-sectional view of the second embodiment.
Figure 5A:
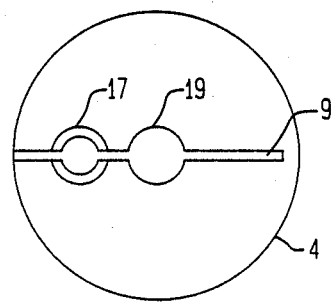
FIGS. 5A and 5B are and side views of a piston used in the second embodiment, respectively.
Figure 5B:
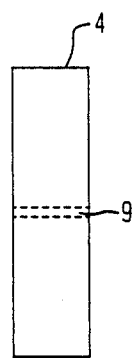

A second embodiment shown in FIGS. 1 and 4 comprises a substrate 1, IC chips 2 mounted on the substrate 1, heat-conductive plates 14 of metal attached on the upper surfaces of the chips 2 with an adhesive agent 15, pistons 20 in contact with the plates 14, and a cold plate 7 having flow paths 6 and a plurality of holes 5 for insertion of the pistons 20. The plate 7 cools the pistons 20 inserted in the holes 5 with a coolant 6a circulating through the flow paths 6. The heat generated from each chip 2 is transmitted through a path extending from the agent 15 via the plate 14, the piston 20 and the plate 7 to the coolant 6a. Referring to FIGS. 5A and 5B, each of the pistons 20 has a through hole 19, a threaded screw hole 17 and a slit 9.

The pistons 20 are inserted into the holes 5 of the cold plate 7 to come into contact with the upper surfaces of the plates 14, respectively. First threaded screws 13 are driven into the through holes 19 of the pistons 20 to be engaged with threaded screw holes 16 formed in the heat conductive plates 14 until flanges formed at the tops of the screws 13 comes to abut against the upper surfaces of the pistons 20, respectively. This fixes the piston 20 on the plates 14. Then, second threaded screws 18 are mated with the screw holes 17 of the pistons 20. By tightening the screws 18 in the screw holes 17, the slits on the pistons 20 are expanded to fix the pistons 20 snugly in the holes 5 of the cold plate through friction.

Figure 6:
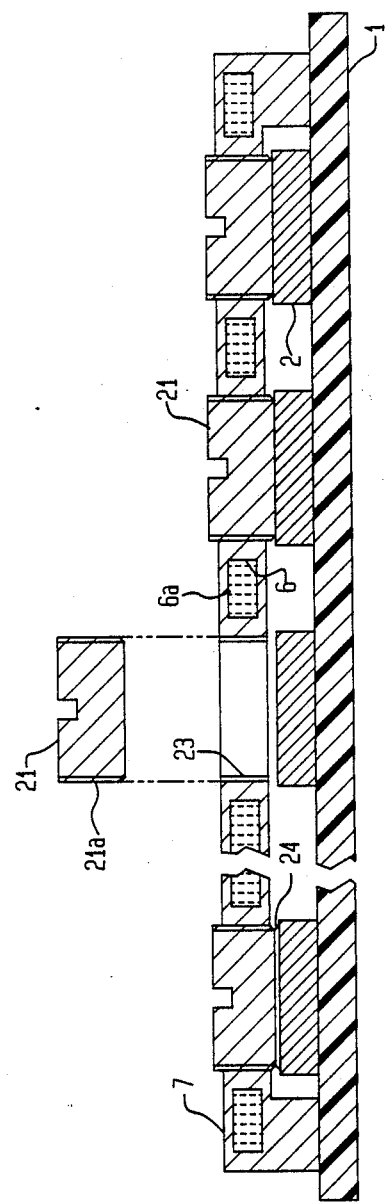
FIG. 6 shows a cross-sectional view of the third embodiment.

Referring to FIG. 6, a third embodiment of the invention comprises a substrate 1, IC chips 2 mounted on the substrate 1, and a cold plate 7 having flow paths and a plurality of threaded holes 23 for insertion of pistons 21. The plate 7 cools the pistons 21 inserted in the threaded holes 23 with a coolant 6a circulating through the flow paths. A threaded portion 21a is formed on the outer periphery of each of the pistons 21 to be mated with a corresponding one of the threaded holes 23 of the cold plate 7. Each of the lower surfaces of the pistons 21 and a corresponding one of the upper surfaces of the chips 2 are either directly or through an intermediary member 24 in contact with each other. The intermediary member 24 may be a heat conductive compound having an elasticity or an elastic heat-conductive sheet.

While this invention has been described in conjunction with the preferred embodiments thereof, the invention is not limited thereto as it will now readily be possible for those skilled in the art to put this invention into practice in various other manners within the scope of the claims.

What is claimed is:

1. A cooling structure comprising:
   heat generating electronic components mounted on a substrate;
   a cold plate fixed on said substrate which is provided with cold plate through holes opposed to the respective upper surfaces of said heat generating electronic components;
   flow paths formed within said cold plate for circulating a coolant;
   an inlet provided on a side of said cold plate for supplying said coolant into said flow paths;
   an outlet provided on a side of said cold plate for exhausting said coolant from said flow paths; and
   pistons inserted through and held within respective said cold plate through holes so that the lower surfaces of said pistons come into thermal contact with said upper surfaces of said heat generating electronic components.

2. A cooling structure as claimed in claim 1, wherein an intermediary member made of a heat-conductive material is interposed between each of said lower surfaces of said pistons and a corresponding one of said upper surfaces of said electronic components.

3. A cooling structure as claimed in claim 1, wherein each of said pistons comprises:
   a longitudinal slit extending through the center thereof;
   a threaded hole formed within said slit; and
   a screw which is inserted into said threaded hole so as to expand said slit for causing the wall surface of a respective cold plate through hole, in which a respective piston is inserted, to snugly come into contact with the outer surface of a respective piston.

4. A cooling structure as claimed in claim 2, wherein said intermediary member has a first threaded hole; and each of said pistons comprises:
   a longitudinal slit extending through the center thereof; a piston through hole provided at the center thereof;
   a first screw inserted through said piston through hole to be engaged with said first threaded hole;
   a second threaded hole formed within said slit at a position near said piston through hole; and
   a second screw inserted into said second threaded hole so as to expand said slit for causing the wall surface of a respective cold plate through hole, in which a respective piston in inserted, to come into contact with the outer surface of a respective piston.

5. A cooling structure as claimed in claim 1, wherein said cold plate through holes are threaded holes and said pistons are screws to be engaged with said cold plate through holes.

6. A cooling structure as claimed in claim 5, wherein an intermediary member made of a heat-conductive material is interposed between each of the lower surfaces of said pistons and a corresponding one of the upper surfaces of said electronic components.

7. A cooling structure as claimed in claim 1, wherein said pistons are cylindrical.

* * * * *